(12) United States Patent
Choi et al.

(10) Patent No.: US 12,707,849 B2
(45) Date of Patent: Aug. 11, 2026

(54) DISPLAY DEVICE AND INK COMPOSITION FOR THE SAME

(71) Applicant: Samsung Display Co., Ltd., Yongin-si (KR)

(72) Inventors: Yongseok Choi, Yongin-si (KR); Minseok Kim, Uijeongbu-si (KR); Songyi Kim, Suwon-si (KR); Sujin Kim, Seoul (KR); Dong Gyu Baeck, Asan-si (KR); Keunchan Oh, Hwaseong-si (KR); Won-Gap Yoon, Suwon-si (KR); Myungjin Lee, Hwaseong-si (KR); Hyeokjin Lee, Seongnam-si (KR); Hoyeon Ji, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 756 days.

(21) Appl. No.: 17/887,897

(22) Filed: Aug. 15, 2022

(65) Prior Publication Data

US 2023/0157119 A1 May 18, 2023

(30) Foreign Application Priority Data

Nov. 18, 2021 (KR) ........................ 10-2021-0159346

(51) Int. Cl.
*H10K 59/38* (2023.01)
*H10K 59/122* (2023.01)
*H10K 59/80* (2023.01)

(52) U.S. Cl.
CPC ........... *H10K 59/38* (2023.02); *H10K 59/122* (2023.02); *H10K 59/877* (2023.02)

(58) Field of Classification Search
None
See application file for complete search history.

(56) References Cited

U.S. PATENT DOCUMENTS

| | | | | |
|---|---|---|---|---|
| 10,414,933 | B2 | 9/2019 | Kasperchik et al. | |
| 10,928,678 | B2 | 2/2021 | Lee et al. | |
| 10,971,557 | B2 | 4/2021 | Jeong et al. | |
| 11,092,842 | B2 | 8/2021 | Kim et al. | |
| 11,094,741 | B2 | 8/2021 | Kim et al. | |
| 2021/0074770 | A1* | 3/2021 | Choe | G02B 5/206 |

FOREIGN PATENT DOCUMENTS

| | | | | |
|---|---|---|---|---|
| CN | 112285999 | A * | 1/2021 | C08K 3/013 |
| JP | 2020034900 | A | 3/2020 | |
| KR | 1020190066109 | A | 6/2019 | |
| KR | 20200120793 | A | 10/2020 | |
| KR | 1020200145900 | A | 12/2020 | |

OTHER PUBLICATIONS

Translation of CN-112285999-A into English; Jin et al. (Year: 2021).*

* cited by examiner

*Primary Examiner* — Brian M Butcher
(74) *Attorney, Agent, or Firm* — CANTOR COLBURN LLP

(57) ABSTRACT

A display device includes a lower panel including a base layer and a display element layer disposed on the base layer, and an upper panel including a light control layer, where the light control layer includes a partition pattern and a light control unit. The light control unit includes a first scatterer and a second scatterer, and a diameter of the first scatterer is different from a diameter of the second scatterer.

13 Claims, 10 Drawing Sheets

FIG. 1A

DD
DA
NDA
NPXA
I
I'
PXA
PXA-R
PXA-G
PXA-B
DR1
DR2
DR3

3rd
2nd
1st
3rd
2nd
1st

DISPLAY DEVICE AND INK COMPOSITION FOR THE SAME

This application claims priority to Korean Patent Application No. 10-2021-0159346, filed on Nov. 18, 2021, and all the benefits accruing therefrom under 35 U.S.C. § 119, the content of which in its entirety is herein incorporated by reference.

BACKGROUND

1. Field

Embodiments of the disclosure herein relate to a display device and an ink composition, and more particularly, to an ink composition for forming a light control layer included in a display device, and a display device having improved reliability.

2. Description of the Related Art

A display device includes a display panel that emits light. The display panel may include an organic light-emitting material or a quantum dot light-emitting material as a light-emitting material.

The display device may further include a light control layer configured to control light emitted from the display panel. The light control layer may be produced from a composition including a color conversion material and a scatterer.

SUMMARY

In an display device including a light control layer formed using a composition including a color conversion material and a scatterer, the quality of the light emitted from the display device or the display quality of the display device may be improved by improving the quality of the composition.

Embodiments of the disclosure provide a display device having improved display quality and reliability.

Embodiments of the disclosure also provide an ink composition in which the settling rate of a scatterer is reduced.

An embodiment of the invention provides a display device including: a lower panel including a base layer and a display element layer disposed on the base layer; and an upper panel including a light control layer, where light control layer includes a partition pattern and a light control unit, where the light control unit includes a first scatterer and a second scatterer, and a diameter of the first scatterer is different from a diameter of the second scatterer.

In an embodiment, the diameter of the first scatterer may be in a range of about 150 nanometers (nm) to about 250 nm.

In an embodiment, the diameter of the second scatterer may be in a range of about 50 nm to about 150 nm.

In an embodiment, each of the first scatterer and the second scatterer may be provided in plurality, and a number of the plurality of first scatterers may be less than a number of the plurality of second scatterers.

In an embodiment, each of the first scatterer and the second scatterer may independently include at least one selected from $TiO_2$, ZnO, $Al_2O_3$, $SiO_2$, and hollow silica.

In an embodiment, the first scatterer and the second scatterer may include a same material as each other.

In an embodiment, the display element layer may include a light-emitting element which emits blue light, and the light control unit may include: a first light control unit including a first quantum dot which converts the blue light into red light; a second light control unit including a second quantum dot which converts the blue light into green light; and a third light control unit which transmits the blue light, where each of the first to third light control units may include the first scatterer and the second scatterer.

In an embodiment, the upper panel may further include a color filter layer disposed on the light control layer.

In an embodiment, the color filter layer may include a first filter which transmits the red light and is disposed on the first light control unit; a second filter which transmits the green light and is disposed on the second light control unit; and a third filter which transmits the blue light.

In an embodiment, the display element layer may include: a pixel defining film, where a light-emitting opening is defined in the pixel defining film; and a light-emitting element including a first electrode having a top surface exposed through the light-emitting opening, a second electrode facing the first electrode, and a light-emitting layer disposed between the first electrode and the second electrode, where the light-emitting opening may overlap the light control unit.

In an embodiment of the invention, a display device includes: a lower panel including a display element layer which emits a first light; and an upper panel including a light control layer including a plurality of first scatterers and a plurality of second scatterers, where each of the plurality of first scatterers and the plurality of second scatterers scatters the first light, where: an average diameter of the plurality of first scatterers is different from an average diameter of the plurality of second scatterers; the average diameter of the plurality of first scatterers is in a range of about 150 nm to about 250 nm; and the average diameter of the plurality of second scatterers is in a range of about 50 nm to about 150 nm.

In an embodiment, each of the plurality of first scatterers and the plurality of second scatterers may include an inorganic material.

In an embodiment, the inorganic material may include at least one selected from $TiO_2$, ZnO, $Al_2O_3$, $SiO_2$, and hollow silica.

In an embodiment, the wavelength of the first light may be in a range of about 410 nm to about 480 nm.

In an embodiment, a plurality of light-emitting regions may be defined in the display element layer, the light control layer may include a first light control unit, a second light control unit, and a third light control unit, which overlap the plurality of light-emitting regions, respectively, and each of the first to third light control units may include the plurality of first scatterers and the plurality of second scatterers.

In an embodiment, the first light control unit may further include a first quantum dot which converts the first light into a second light different from the first light, and the second light control unit may further include a second quantum dot which converts the first light into a third light different from the first light and the second light.

In an embodiment of the invention, an ink composition includes a plurality of first scatterers including a first inorganic material, a plurality of second scatterers including a second inorganic material, and a base resin, wherein: an average diameter of the plurality of first scatterers is different from an average diameter of the plurality of second scatterers; the average diameter of the plurality of first scatterers is in a range of about 150 nm to about 250 nm; and the average diameter of the plurality of second scatterers is in a range of about 50 nm to about 150 nm.

In an embodiment, each of the first inorganic material and the second inorganic material may include at least one selected from $TiO_2$, ZnO, $Al_2O_3$, $SiO_2$, and hollow silica.

In an embodiment, the ink composition may further include a first quantum dot which converts blue light into red light.

In an embodiment, the ink composition may further include a second quantum dot which converts blue light into green light.

BRIEF DESCRIPTION OF THE DRAWINGS

The above and other features of the invention will become more apparent by describing in further detail embodiments thereof with reference to the accompanying drawings, in which:

Figure 1A:
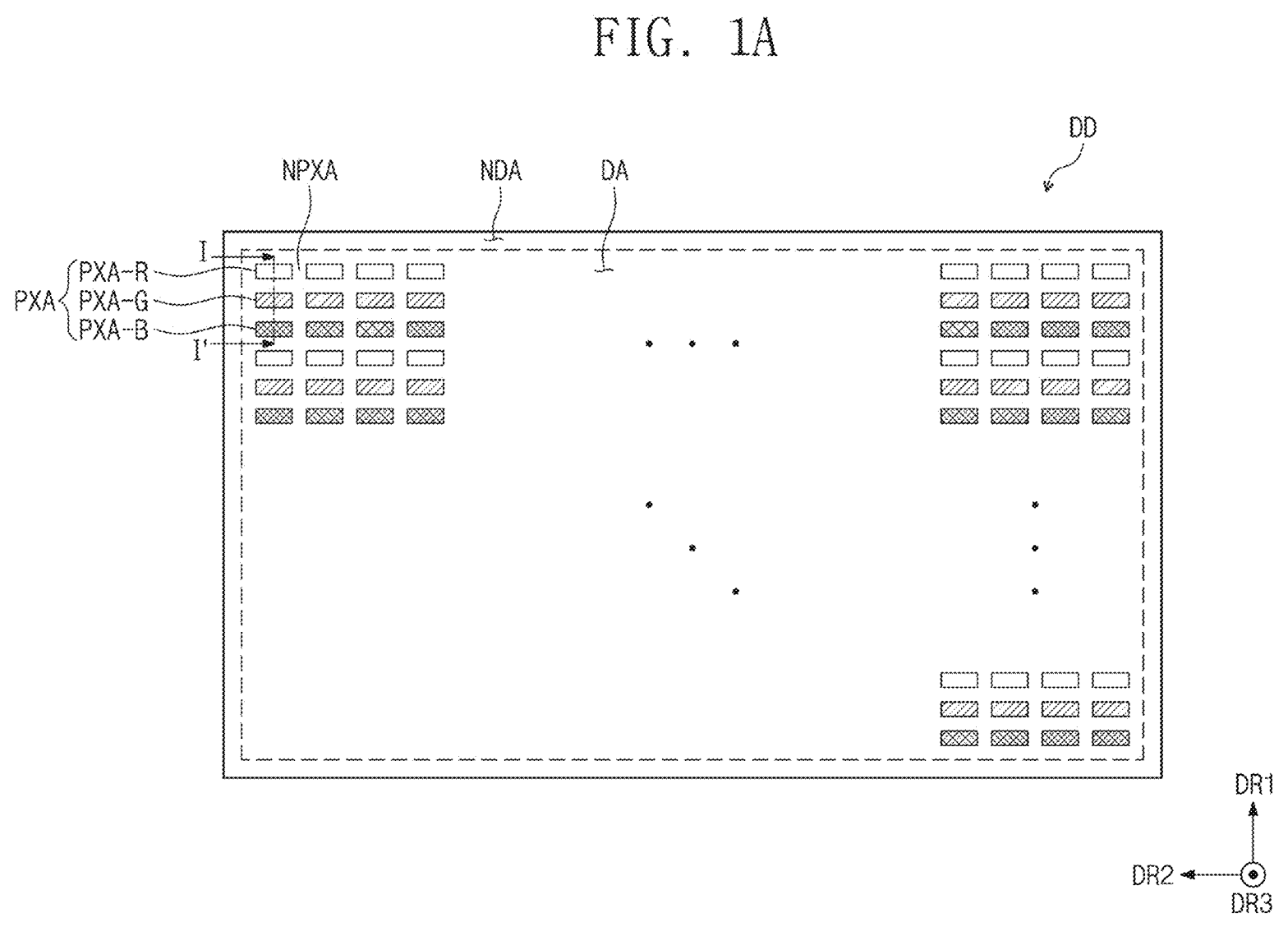

FIG. 1A is a plan view of a display device according to an embodiment of the invention;

DETAILED DESCRIPTION

Figure 1B:
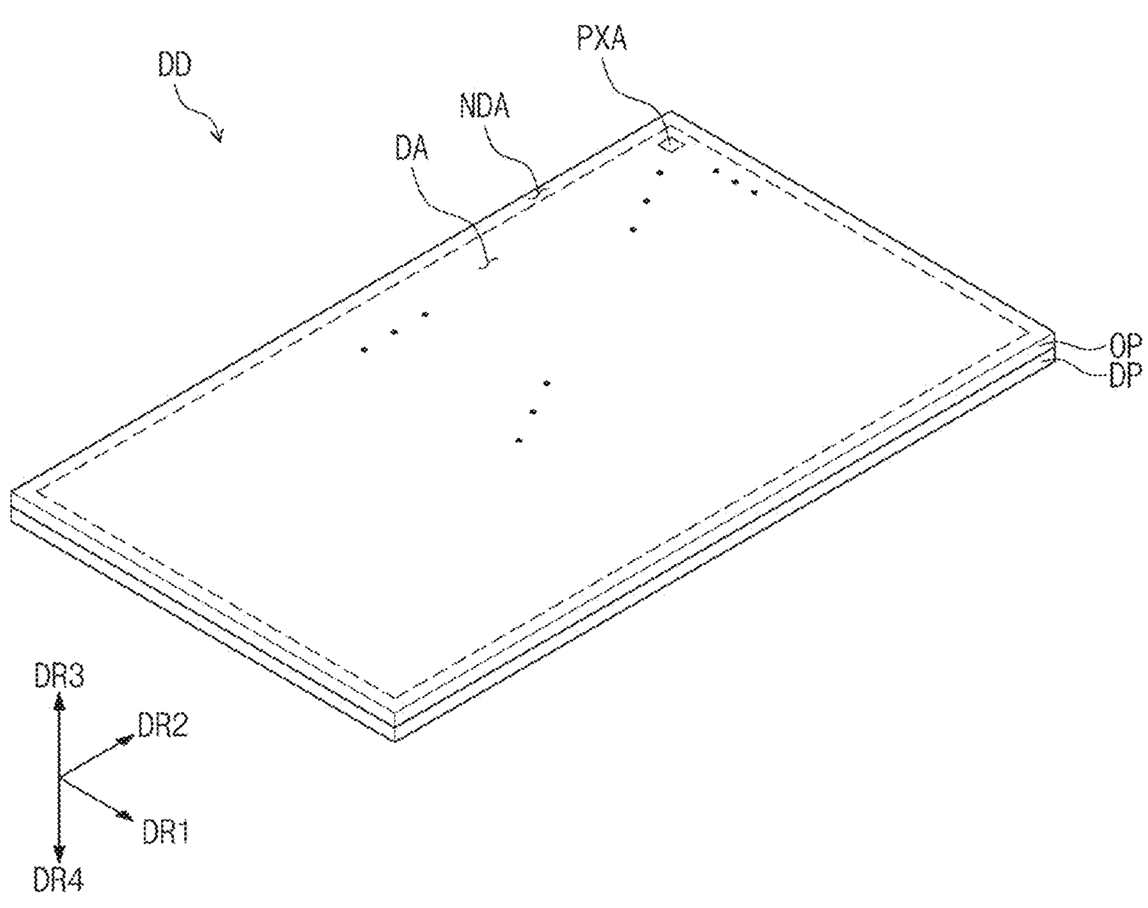
FIG. 1B is a perspective view of the display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will be understood that when an element (or region, layer, portion, etc.) is referred to as being "on", "connected to" or "coupled to" another element, it can be directly on, connected or coupled to the other element, or intervening elements may be present.

Meanwhile, in this specification, the expression "being directly disposed" may mean that there is no layer, film, region, plate, or the like which is added between a part of a layer, film, region, plate, or the like and another part. For example, the expression "being directly disposed" may mean being disposed between two layers or two members without an additional member such as an adhesive member interposed therebetween.

Like reference numerals refer to like elements throughout. In addition, in the drawings, the thicknesses, ratios, and dimensions of elements are exaggerated for effective description of the technical contents. "Or" means "and/or." As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. For example, a first element could be termed a second element without departing from the scope of the invention. Similarly, the second element may also be referred to as the first element. The terms of a singular form include a plural form unless otherwise specified.

Terms, such as "below", "lower", "above", "upper" and the like, are used herein for ease of description to describe one element's relation to another element(s) as illustrated in the figures. The above terms are relative concepts and are described based on the directions indicated in the drawings. In this specification, the expression "being disposed on" may refer to being disposed not only on the upper part of any one member but also on the lower part thereof.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." It will be understood that the terms "comprises" and/or "comprising," or "includes" and/or "including, when used in this specification, specify the presence of stated features, integers, steps, operations, elements, components and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display device according to an embodiment of the invention will be described with reference to the accompanying drawings.

Figure 2:
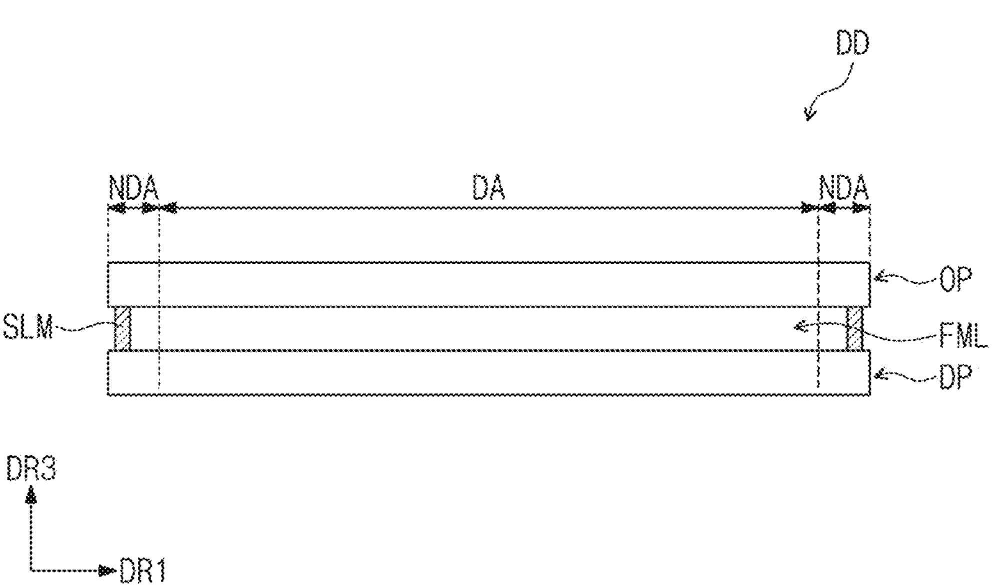
FIG. 2 is a cross-sectional view of the display device according to an embodiment of the invention.

FIG. 1A is a plan view of a display device according to an embodiment of the invention. FIG. 1B is a perspective view of the display device according to an embodiment of the invention. FIG. 2 is a cross-sectional view of the display device according to an embodiment of the invention.

The display device DD according to an embodiment of the invention may be activated according to an electrical signal. In an embodiment, for example, the display device DD may be a mobile phone, a tablet, a car navigation system, a game machine, or a wearable device, but the embodiment of the invention is not limited thereto.

In FIG. 1A and the following drawings, at least one of a first direction DR1 to a fourth direction DR4 are illustrated, and the directions indicated by the first to fourth directions DR1, DR2, DR3 and DR4 described herein are relative concepts and may be converted into other directions.

In this specification, the thickness direction of the display device DD may be parallel to the third direction DR3 which is a direction normal to a plane defined by the first direction DR1 and the second direction DR2. In this specification, the front (or upper surface) and the rear (or lower surface) of the members constituting the display device DD may be defined based on the third direction DR3.

The display device DD according to an embodiment of the invention may include a display region DA and a non-display region NDA adjacent to the display region DA. The display region DA corresponds to a region in which an image is displayed. The display region DA may have a plurality of pixel regions PXA and a peripheral region NPXA defined therein. The plurality of pixel regions PXA may include first to third pixel regions PXA-R, PXA-G, and PXA-B that emit light of different wavelength ranges. The peripheral region NPXA sets boundaries between the first to third pixel regions PXA-R, PXA-G, and PXA-B. In an embodiment, a structure configured to prevent color mixing among the first to third pixel regions PXA-R, PXA-G, and PXA-B, for example, a partition pattern BMP (refer to FIG. 3) and the like, may be disposed in the peripheral region NPXA.

In the display device DD according to an embodiment of the invention illustrated in FIG. 1A, the plurality of pixel regions PXA may include three pixel regions PXA-R, PXA-G, and PXA-B that emit red light, green light, and blue light. In an embodiment, for example, the display device DD according to an embodiment of the invention may include a first pixel region PXA-R, a second pixel region PXA-G, and a third pixel region PXA-B that are divided from one another.

The pixel regions PXA-R, PXA-G, and PXA-B in the display device DD according to an embodiment of the invention may be arranged in a stripe shape. Referring to FIG. 1A, each of a plurality of first pixel regions PXA-R, a plurality of second pixel regions PXA-G, and a plurality of third pixel regions PXA-B may be arranged along the second direction DR2. In such an embodiment, the first pixel regions PXA-R, the second pixel regions PXA-G, and the third pixel regions PXA-B may be repeatedly disposed in the listed order along the first direction DR1.

In an embodiment, as illustrated in FIG. 1A, the areas of the pixel regions PXA-R, PXA-G, and PXA-B are similar to one another, the embodiment of the invention is not limited thereto. Alternatively, the areas of the pixel regions PXA-R, PXA-G, and PXA-B may be different from one another according to the wavelength region of emitted light. Here, the areas of the pixel regions PXA-R, PXA-G, and PXA-B may mean the areas defined on a plane defined by the first direction DR1 and the second direction DR2, or when viewed in the thickness direction or the third direction DR3.

In embodiments, the arrangement shape of the pixel regions PXA-R, PXA-G, and PXA-B is not limited to that illustrated in FIG. 1A, and the first pixel region PXA-R, the second pixel region PXA-G, and the third pixel region PXA-B may be provided in various combinations and arrangement orders according to the characteristics of the display quality desired for the display device DD. In an embodiment, for example, the arrangement of the pixel regions PXA-R, PXA-G, and PXA-B may have a PENTILE® shape or a diamond shape.

In an embodiment, the areas of the pixel regions PXA-R, PXA-G, and PXA-B may be different from one another. In an embodiment of the invention, for example, the area of the second pixel region PXA-G may be smaller than that of the third pixel region PXA-B, but the embodiment of the invention is not limited thereto.

Referring to FIGS. 1A and 1B together, in an embodiment of the invention, the display region DA may have a tetragonal shape. The non-display region NDA may surround the display region DA. Without being limited thereto, however, the shape of the display region DA and the shape of the non-display region NDA may be relatively designed. Alternatively, the non-display region NDA may be omitted.

Figure 3:
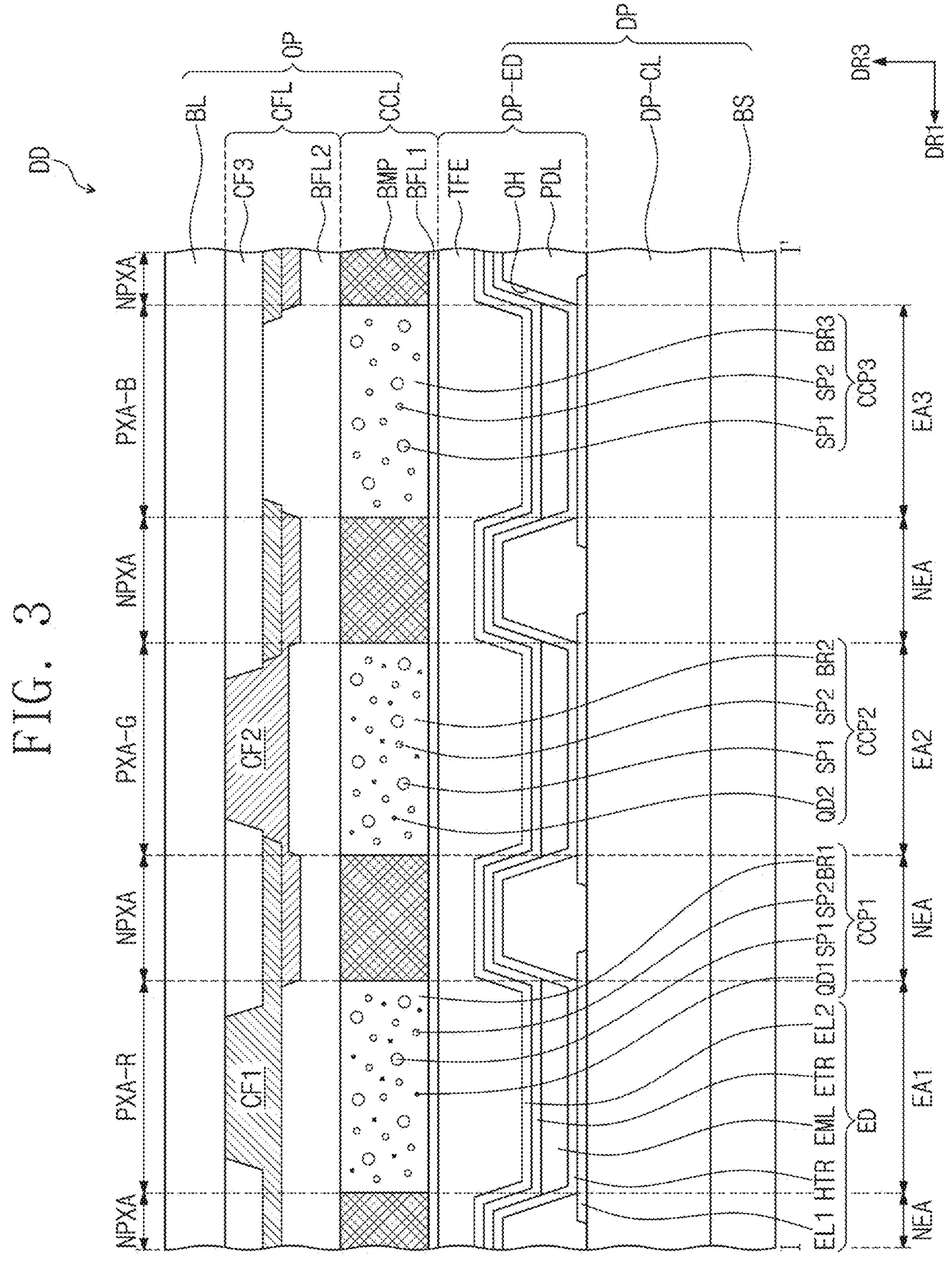
FIG. 3 is a cross-sectional view of the display device according to an embodiment of the invention illustrated in FIG. 1A.

The display device DD according to an embodiment of the invention includes a lower panel DP including a display element layer DP-ED (refer to FIG. 3) and an upper panel OP including a light control layer CCL (refer to FIG. 3). In an embodiment of the invention, the lower panel DP may be referred to as a display panel or a display substrate, and the upper panel OP may be referred to as a light control panel or a light control substrate.

Referring to FIG. 2, the display device DD according to an embodiment of the invention may include an encapsulation part SLM disposed between the lower panel DP and the upper panel OP. The encapsulation part SLM may couple the lower panel DP and the upper panel OP to each other. The encapsulation part SLM may be disposed in the non-display region NDA to couple the lower panel DP and the upper panel OP to each other. The encapsulation part SLM is disposed in the non-display region NDA, which is an outer portion of the display device DD, to prevent foreign substances, oxygen, moisture, and the like from entering into the display device DD from the outside the display device DD. The encapsulation part SLM may include or be formed from a sealant including a curable resin. The sealant may include an epoxy-based resin, an acrylic-based resin, or the like. The sealant may be a thermosetting material or a photocurable material. The sealant may be provided on one surface of the lower panel DP or the upper panel OP, and after bonding the lower panel DP and the upper panel OP to each other to face each other, the sealant may be cured by heat or ultraviolet light to form the encapsulation part SLM.

In the display device DD according to an embodiment of the invention, a filling layer FML may fill a space between the lower panel DP and the upper panel OP.

The filling layer FML may function as a buffer between the lower panel DP and the upper panel OP. In an embodiment of the invention, the filling layer FML may function to absorb a shock and increase the strength of the display device DD. The filling layer FML may be formed from a filling resin including a polymer resin. In an embodiment, for example, the filling layer FML may include or be formed from a filling resin including an acrylic-based resin, an epoxy-based resin, or the like.

FIG. 3 is a cross-sectional view of the display device according to an embodiment of the invention illustrated in FIG. 1A. FIG. 3 is a cross-sectional view corresponding to a cross-sectional view taken along line I-I' of FIG. 1A.

Referring to FIG. 3, the display device DD according to an embodiment of the invention includes a lower panel DP including a display element layer DP-ED and an upper panel OP disposed on the lower panel DP and including a light control layer CCL.

In an embodiment of the invention, the lower panel DP may include a base layer BS, a circuit layer DP-CL disposed on the base layer BS, and a display element layer DP-ED disposed on the circuit layer DP-CL. In such an embodiment, the lower panel DP may include an encapsulation layer TFE disposed in the display element layer DP-ED. The display element layer DP-ED may include a pixel defining film PDL and a light-emitting element ED. The encapsulation layer TFE may cover the upper portion of the display element layer DP-ED. Although not illustrated, the filling layer FML may be disposed on the encapsulation layer TFE.

In the display device DD according to an embodiment of the invention, the lower panel DP may be a light-emitting display panel. In an embodiment, for example, the lower panel DP may be an organic electroluminescence display panel. In an embodiment where the lower panel DP is an organic electroluminescence display panel, the display element layer DP-ED may include an organic electroluminescence element as the light-emitting element ED. However, the embodiment of the invention is not limited thereto. In an alternative embodiment, for example, the display element layer DP-ED may include a quantum dot light-emitting diode ("LED") as the light-emitting element ED. In another alternative embodiment, the display element layer DP-ED may include a micro LED element, a nano LED element, and/or the like as the light-emitting element ED.

In the lower panel DP, the base layer BS may provide a base surface on which the display element layer DP-ED is disposed. The base layer BS may be a glass substrate, a metal substrate, a polymer substrate, or the like. However, the embodiment of the invention is not limited thereto, and alternatively, the base layer BS may be an inorganic layer, a functional layer, or a composite material layer.

The base layer BS may have a multi-layered structure. In an embodiment, for example, the base layer BS may have a three-layer structure of a polymer resin layer, an adhesive layer, and a polymer resin layer. In such an embodiment, the polymer resin layer may include a polyimide-based resin. In such an embodiment, the polymer resin layer may include at least one selected from an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. In this specification, an "X"-based resin means a rein including a functional group of "X".

The circuit layer DP-CL may be disposed on the base layer BS. The circuit layer DP-CL may include an insulating layer, a semiconductor pattern, a conductive pattern, a signal line, or the like. An insulating layer, a semiconductor layer, and a conductive layer may be formed on the base layer BS by a method such as coating and deposition, and then, the insulating layer, the semiconductor layer, and the conductive layer may be selectively patterned through a plurality of photolithography processes. Thereafter, the semiconductor pattern, the conductive pattern, and the signal line, which are included in the circuit layer DP-CL, may be formed. In an embodiment of the invention, the circuit layer DP-CL may include a transistor, a buffer layer, and a plurality of insulating layers.

Referring to FIG. 3, according to an embodiment of the invention, the light-emitting element ED may include a first electrode ELL a second electrode EL2 facing the first electrode ELL and a light-emitting layer EML disposed between the first electrode EL1 and the second electrode EL2. The light-emitting layer EML included in the light-emitting element ED may include an organic light-emitting material or a quantum dot as a light-emitting material. The light-emitting element ED may further include a hole control layer HTR and an electron control layer ETR. In an embodiment, although not illustrated, the light-emitting element ED may further include a capping layer (not illustrated) disposed on the second electrode EL2.

The pixel defining film PDL may be disposed on the circuit layer DP-CL and cover a portion of the first electrode EL1. A light-emitting opening OH may be defined in the pixel defining film PDL. The light-emitting opening OH of the pixel defining film PDL exposes at least a portion of the first electrode EL1. In an embodiment, as shown in FIG. 3, light-emitting regions EA1, EA2, and EA3 are defined to correspond to a partial region of the first electrode EL1 exposed by the light-emitting opening OH.

The lower panel DP may include a first light-emitting region EA1, a second light-emitting region EA2, and a third light-emitting region EA3. The first light-emitting region EA1, the second light-emitting region EA2, and the third light-emitting region EA3 may be divided by the pixel defining films PDL. The first light-emitting region EA1, the second light-emitting region EA2, and the third light-emitting region EA3 may correspond to the first pixel region PXA-R, the second pixel region PXA-G, and the third pixel region PXA-B, respectively. In this specification, the expression "correspond to" means that two components overlap each other when viewed in the thickness direction or the third direction DR3 of the display device DD, and is not limited to having a same area.

The light-emitting regions EA1, EA2, and EA3 may overlap the pixel regions PXA-R, PXA-G, and PXA-B and may not overlap the peripheral region NPXA. Regions overlapping the peripheral region NPXA may be defined as a non-emitting region NEA.

In an embodiment, as shown in FIG. 3, the pixel regions PXA-R, PXA-G, and PXA-B divided by the partition patterns BMP and the light-emitting regions EA1, EA2, and EA3 divided by the pixel defining films PDL may have a same area as each other when viewed in the thickness direction or the third direction DR3, but the embodiment of the invention is not limited thereto. In an alternative embodiment, for example, when viewed in the thickness direction or the third direction DR3, the areas of the pixel regions PXA-R, PXA-G, and PXA-B divided by the partition patterns BMP may be larger than the areas of the light-emitting regions EA1, EA2, and EA3 divided by the pixel defining films PDL.

In an embodiment, the first electrode EL1 is disposed on the circuit layer DP-CL in the light-emitting element ED. The first electrode EL1 may be an anode or a cathode. In an embodiment, the first electrode EL1 may be a pixel electrode. The first electrode EL1 may be a transmissive electrode, a semi-transmissive electrode, or a reflective electrode.

The hole control layer HTR may be disposed between the first electrode EL1 and the light-emitting layer EML. The hole control layer HTR may include at least one of a hole injection layer, a hole transport layer, or an electron blocking layer. The hole control layer HTR may be disposed as a common layer to overlap all of the light-emitting regions EA1, EA2, and EA3 and the pixel defining films PDL that divide the light-emitting regions EA1, EA2, and EA3. However, the embodiment of the invention is not limited thereto, and alternatively, the hole control layer HTR may be patterned and then provided to be separately disposed to correspond to each of the light-emitting regions EA1, EA2, and EA3.

The light-emitting layer EML is disposed on the hole control layer HTR. In an embodiment of the invention, the light-emitting layer EML may be provided as a common layer to overlap all of the light-emitting regions EA1, EA2, and EA3 and the pixel defining films PDL that divide the light-emitting regions EA1, EA2, and EA3. In an embodiment of the invention, the light-emitting layer EML may emit blue light. The light-emitting layer EML may overlap all of the hole control layer HTR and the electron control layer ETR.

However, the embodiment of the invention is not limited thereto, and in an alternative embodiment of the invention, the light-emitting layer EML may be disposed only in the light-emitting opening OH. In such an embodiment, the light-emitting layer EML may be divided and formed in plurality to overlap each of the first to third light-emitting regions EA1, EA2, and EA3. The plurality of divided light-emitting layers EML may all emit blue light or may emit light of different wavelength ranges from each other.

The light-emitting layer EML may have a single-layered structure composed of a single material, a single-layered structure composed of a plurality of different materials, or a multi-layered structure with a plurality of layers composed of a plurality of different materials from each other. The light-emitting layer EML may include a fluorescent or phosphorescent material. In an embodiment of the invention, the light-emitting layer EML in the light-emitting element may include an organic light-emitting material, a metal organic complex, a quantum dot, or the like as a light-emitting material.

The electron control layer ETR may be disposed between the light-emitting layer EML and the second electrode EL2. The electron control layer ETR may include at least one selected from an electron injection layer, an electron transport layer, and a hole blocking layer. Referring to FIG. 3, the electron control layer ETR may be disposed as a common layer to overlap all of the light-emitting regions EA1, EA2, and EA3 and the pixel defining films PDL that divide the light-emitting regions EA1, EA2, and EA3. However, the embodiment of the invention is not limited thereto, and alternatively, the electron control layer ETR may be patterned and then provided to be separately disposed to correspond to each of the light-emitting regions EA1, EA2, and EA3.

The second electrode EL2 is provided on the electron control layer ETR. The second electrode EL2 may be a common electrode. The second electrode EL2 may be a cathode or an anode, but the embodiment of the invention is not limited thereto. In an embodiment, for example, when the first electrode EL1 is an anode, the second electrode EL2 may be a cathode, and when the first electrode EL1 is a cathode, the second electrode EL2 may be an anode. The second electrode EL2 may be a transmissive electrode, a semi-transmissive electrode, or a reflective electrode.

The encapsulation layer TFE may be disposed on the light-emitting element ED. In an embodiment of the invention, for example, the encapsulation layer TFE may be disposed on the second electrode EL2. In an embodiment, where the light-emitting element ED includes a capping layer (not illustrated), the encapsulation layer TFE may be disposed on the capping layer (not illustrated). The encapsulation layer TFE may include at least one organic layer and at least one inorganic layer, and the inorganic layer and the organic layer may be alternately disposed one on another.

In an embodiment of the invention, the upper panel OP may be disposed on the lower panel DP. The upper panel OP may include a light control layer CCL, a color filter layer CFL, and a base substrate BL.

The light control layer CCL may include a light converter and a scatterer. The light converter may be a quantum dot, a phosphor, or the like. In an embodiment, the light control layer CCL may include a quantum dot, or a phosphor. The light converter may convert the wavelength of received light and emit the converted light. The light control layer CCL may include a plurality of light converters or may include two or more types of light converters.

The scatterer may scatter light emitted from the lower panel DP. In an embodiment, for example, the scatterer may scatter light emitted from the lower panel DP in multiple angles. In such an embodiment where the light control layer CCL includes a scatterer, the light control layer CCL may efficiently provide the light converter with light emitted from the lower panel DP.

The light control layer CCL may include a plurality of light control units CCP1, CCP2, and CCP3 and partition patterns BMP. The light control units CCP1, CCP2, and CCP3 may be spaced apart from one another. The light control units CCP1, CCP2, and CCP3 may be disposed to be spaced apart from one another by the partition patterns BMP. However, the embodiment of the invention is not limited thereto. In an embodiment, as shown in FIG. 3, the partition patterns BMP may not overlap the light control units CCP1, CCP2, and CCP3, but not being limited thereto. Alternatively, the edges of the light control units CCP1, CCP2, and CCP3 may overlap at least portions of the partition patterns BMP.

The light control units CCP1, CCP2, and CCP3 may be portions that convert the wavelength of light provided from the display element layer DP-ED or transmit light provided therefrom.

The light control layer CCL includes a first light control unit CCP1 including a first quantum dot QD1 that converts a first color light provided from the light-emitting element ED into a second color light, a second light control unit CCP2 including a second quantum dot QD2 that converts the first color light into a third color light, and a third light control unit CCP3 that transmits the first color light.

In an embodiment of the invention, where the light-emitting element ED provides the upper panel OP with blue light as the first color light, the first light control unit CCP1 may provide red light as the second color light, and the second light control unit CCP2 may provide green light as the third color light. The third light control unit CCP3 may transmit and provide the blue light as the first color light provided from the light-emitting element ED. In an embodiment, for example, the first quantum dot QD1 may be a red quantum dot, and the second quantum dot QD2 may be a green quantum dot.

The quantum dots QD1 and QD2 included in the light control layer CCL may have a core-shell structure, and the cores of the quantum dots QD1 and QD2 may include at least one selected from a group II-VI compound, a group III-VI compound, a group compound, a group III-V compound, a group IV-VI compound, a group IV element, a group IV compound, and combinations thereof.

The group II-VI compound may be selected from: a binary compound selected from CdSe, CdTe, CdS, ZnS, ZnSe, ZnTe, ZnO, HgS, HgSe, HgTe, MgSe, MgS, and mixtures thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The group III-VI compound may include a binary compound such as $In_2S_3$ and $In_2Se_3$, a ternary compound such as $InGaS_3$ and $InGaSe_3$, or any combination thereof.

The group compound may be selected from a ternary compound selected from AgInS, $AgInS_2$, CuInS, $CuInS_2$, $AgGaS_2$, $CuGaS_2$ $CuGaO_2$, $AgGaO_2$, $AgAlO_2$ and mixtures thereof, or a quaternary compound such as $AgInGaS_2$, and $CuInGaS_2$.

The group III-V compound may be selected from: a binary compound selected from GaN, GaP, GaAs, GaSb, AlN, AlP, AlAs, AlSb, InN, InP, InAs, InSb, and mixtures thereof a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In an embodiment, the group III-V compound may further include a group II metal. In an embodiment, for example, InZnP and the like may be selected as a group III-II-V compound.

The group IV-VI compound may be selected from a binary compound selected from SnS, SnSe, SnTe, PbS, PbSe, PbTe, and mixtures thereof a ternary compound selected from SnSeS, SnSeTe, SnSTe, PbSeS, PbSeTe, PbSTe, SnPbS, SnPbSe, SnPbTe, and mixtures thereof and a quaternary compound selected from SnPbSSe, SnPbSeTe, SnPbSTe, and mixtures thereof. The group IV element may be selected from Si, Ge, and mixtures thereof. The group IV compound may be a binary compound selected from SiC, SiGe, and mixtures thereof.

In an embodiment, the binary compound, the ternary compound, or the quaternary compound may be present in a particle at a uniform concentration, or may be present in a same particle by being divided into states in which the concentration distributions thereof are partially different from one another. In an embodiment, one quantum dot QD1 or QD2 may have a core-shell structure surrounding another quantum dot QD1 or QD2. In the core-shell structure, the concentration of an element present in a shell may have a concentration gradient that decreases as being toward the core.

In some embodiments, the quantum dots QD1 and QD2 may have a core-shell structure including the aforementioned core, which includes a nanocrystal, and a shell surrounding the core. The shells of the quantum dots QD1 and QD2 may serve as a protective layer configured to prevent the chemical deformation of the core to maintain semiconductor properties and/or a charging layer configured to impart electrophoretic properties to the quantum dots QD1 and QD2. The shells may be single-layered or multi-layered. In an embodiment, for example, the shells of the quantum dots QD1 and QD2 may include a metal or non-metal oxide, a semiconductor compound, or a combination thereof.

In an embodiment, for example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but the invention is not limited thereto.

In an embodiment, the semiconductor compound may include, as an example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like. However, the invention is not limited thereto.

The quantum dots QD1 and QD2 may have a full width of half maximum ("FWHM") of a light-emitting wavelength spectrum of about 45 nanometers (nm) or less, e.g., about 40 nm or less, or about 30 nm or less. In such an embodiment, where the quantum dots QD1 and QD2 have a FWHM in those ranges, color purity or color reproducibility may be improved. In such an embodiment, since light emitted through the quantum dots QD1 and QD2 is emitted in all directions, a wide viewing angle may be improved.

In an embodiment, the shapes of the quantum dots QD1 and QD2 are not particularly limited to those generally used in the art, but more specifically, spherical, pyramidal, multi-arm, or cubic nanoparticles, nanotubes, nanowires, nanofibers, or nanosheets may be used as the shapes thereof.

The quantum dots QD1 and QD2 may control the color of light emitted according to a particle size, and accordingly, the quantum dots QD1 and QD2 may have various light-emitting colors such as blue, red, and green. As the particle size of the quantum dots QD1 and QD2 decreases, light may be emitted in a short wavelength region. In an embodiment, for example, the particle size of the quantum dots QD1 and QD2 for emitting green light from the quantum dots QD1 and QD2 having a same core may be smaller than the particle size of the quantum dots QD1 and QD2 for emitting red light. In such an embodiment, the particle size of the quantum dots QD1 and QD2 for emitting blue light from the quantum dots QD1 and QD2 having the same core may be smaller than the particle size of the quantum dots QD1 and QD2 for emitting green light. However, the embodiment of the invention is not limited thereto, and even in the quantum dots QD1 and QD2 having the same core as each other, the particle size may be adjusted according to the material, which forms the shell, and the thickness of the shell.

In an embodiment, where the quantum dots QD1 and QD2 have various light-emitting colors such as blue, red, and green, the quantum dots QD1 and QD2 having different light-emitting colors may have different core materials from each other.

The light control layer CCL includes a scatterer. The light control layer CCL includes a first scatterer SP1 and a second scatterer SP2 having a size different from that of the first scatterer SP1. in an embodiment, the size of the first scatterer SP1 may be greater than the size of the second scatterer SP2. The light control layer CCL may further include an additional scatterer besides the first scatterer SP1 and the second scatterer SP2.

The first light control unit CCP1 may include a first quantum dot QD1, a first scatterer SP1 and a second scatterer SP2, the second light control unit CCP2 may include a second quantum dot QD2, a first scatterer SP1 and a second scatterer SP2, and the third light control unit CCP3 may not include the quantum dots QD1 and QD2 and may include a first scatterer SP1 and a second scatterer SP2.

Each of the first scatterer SP1 and the second scatterer SP2 may include an inorganic material. Each of the first scatterer SP1 and the second scatterer SP2 may be an inorganic particle. The first scatterer SP1 may include a first inorganic material, and the second scatterer SP2 may include a second inorganic material. The first inorganic material and the second inorganic material may be the same as or different from each other. In an embodiment, for example, each of the first inorganic material and the second inorganic material may include at least one selected from $TiO_2$, ZnO, $Al_2O_3$, $SiO_2$, and hollow silica.

In such an embodiment, each of the first scatterer SP1 and the second scatterer SP2 may include at least one selected from $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica. In an embodiment, for example, each of the first scatterer SP1 and the second scatterer SP2 may be a $TiO_2$ particle. However, the embodiment of the invention is not limited thereto.

In an embodiment of the invention, each of the first scatterer SP1 and the second scatterer SP2 may have a spherical shape. In an embodiment, for example, each of the first scatterer SP1 and the second scatterer SP2 may be a spherical particle. An average diameter of the first scatterers SP1 may be different from an average diameter of the second scatterers SP2. in an embodiment, the average diameter of the first scatterers SP1 may be larger than the average diameter of the second scatterers SP2.

The average diameter of the first scatterers SP1 is in a range of about 150 nm to about 250 nm. In an embodiment, for example, the average diameter of the first scatterers SP1 may be about 180 nm. The average diameter of the second scatterers SP2 is in a range of about 50 nm to about 150 nm. In an embodiment, for example, the average diameter of the second scatterers SP2 may be about 100 nm. In such an embodiment where the average diameters of the first scatterer SP1 and the second scatterer SP2 satisfy the above ranges, the light transmittance of the light control layer CCL may increase. A detailed description thereof will be given later.

The light control layer CCL may further include an additional scatterer in addition to the first scatterer SP1 and the second scatterer SP2. In an embodiment, for example, the light control layer CCL may additionally include a scatterer having an average diameter of less than about 50 nm or a scatterer having an average diameter of greater than about 250 nm.

Each of the first light control unit CCP1, the second light control unit CCP2, and the third light control unit CCP3 may include a base resin BR1, BR2, or BR3 configured to disperse the quantum dots QD1 and QD2 and/or the scatterers SP1 and SP2. The base resin BR1, BR2, or BR3 is a medium in which the quantum dots QD1 and QD2 and the scatterers SP1 and SP2 are dispersed, and may be formed of various resin compositions that may be generally referred to as binders. In an embodiment, for example, the base resins BR1, BR2, and BR3 may be an acrylic-based resin, a urethane-based resin, a silicone-based resin, or an epoxy-based resin. The base resins BR1, BR2, and BR3 may be transparent resins. The base resins BR1, BR2, and BR3 may include a first base resin BR1 included in the first light control unit CCP1, a second base resin BR2 included in the second light control unit CCP2, and a third base resin BR3 included in the third light control unit CCP3. In an embodiment of the invention, the first to third base resins BR1, BR2, and BR3 may be formed through a same process as each other.

In an embodiment of the invention, the first light control unit CCP1 includes a first quantum dot QD1, a first scatterer SP1, and a second scatterer SP2, which are dispersed in the first base resin BR1. The second light control unit CCP2 includes a second quantum dot QD2, a first scatterer SP1, and a second scatterer SP2, which are dispersed in the second base resin BR2. The third light control unit CCP3 may include a first scatterer SP1 and a second scatterer SP2, which are dispersed in the third base resin BR3.

The light control layer CCL may include a barrier layer BFL1. The barrier layer BFL1 may serve to prevent the penetration of moisture and/or oxygen (hereinafter, referred to as 'moisture/oxygen'). The barrier layer BFL1 may cover the light control units CCP1, CCP2, and CCP3 to block the light control units CCP1, CCP2, and CCP3 from being exposed to moisture/oxygen.

In the display device DD according to an embodiment of the invention, the upper panel OP may include a color filter layer CFL disposed on the light control layer CCL.

The color filter layer CFL may include a barrier layer BFL2 and filters CF1, CF2, and CF3. The barrier layer BFL2 may cover the filters CF1, CF2, and CF3.

The barrier layers BFL1 and BFL2 may include at least one inorganic layer. In an embodiment, the barrier layers BFL1 and BFL2 may include an inorganic material. In an embodiment, for example, the barrier layers BFL1 and BFL2 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, a metal thin film having a light transmittance, or the like. In an embodiment, the barrier layers BFL1 and BFL2 may further include an organic layer. The barrier layers BFL1 and BFL2 may be formed of or defined by a single layer or a plurality of layers.

The filters CF1, CF2, and CF3 included in the color filter layer CFL may include a first filter CF1 configured to transmit the second color light, a second filter CF2 configured to transmit the third color light, and a third filter CF3 configured to transmit the first color light. In an embodiment, for example, the first filter CF1 may be a red filter, the second filter CF2 may be a green filter, and the third filter CF3 may be a blue filter. Each of the filters CF1, CF2, and CF3 may contain a polymer photosensitive resin and a pigment or dye. The first filter CF1 may contain a red pigment or dye, the second filter CF2 may include a green pigment or dye, and the third filter CF3 may include a blue pigment or dye. However, the embodiment of the invention is not limited thereto, and alternatively, the third filter CF3 may not contain a pigment or dye. The third filter CF3 may include a polymer photosensitive resin and may not include a pigment or dye. The third filter CF3 may be transparent. The third filter CF3 may include or be formed of a transparent photosensitive resin.

In an embodiment of the invention, the first filter CF1 and the second filter CF2 may be yellow filters. The first filter CF1 and the second filter CF2 may be integrally provided with each other as a single unitary part without being separated from each other. Each of the first to third filters CF1, CF2, and CF3 may be disposed to correspond to each of the first pixel region PXA-R, the second pixel region PXA-G, and the third pixel region PXA-B. In an embodiment, each of the first to third filters CF1, CF2, and CF3 may be disposed to correspond to each of the first to third light control units CCP1, CCP2, and CCP3.

In an embodiment, portions of the plurality of filters CF1, CF2, and CF3 configured to transmit different color lights from each other may be disposed to overlap each other and the overlapping portions may correspond to the peripheral regions NPXA disposed between the pixel regions PXA-R, PXA-G, and PXA-B. The plurality of filters CF1, CF2, and CF3 may be disposed to overlap each other in the third direction DR3, which is the thickness direction, to define the boundaries between adjacent pixel regions PXA-R, PXA-G, and PXA-B. Alternatively, the color filter layer CFL may include a light blocking part (not illustrated) that define the boundaries between adjacent filters CF1, CF2, and CF3. The light blocking part (not illustrated) may be formed of a blue filter or may be formed by containing an organic light blocking material or an inorganic light blocking material, which includes a black pigment or a black dye.

In an embodiment of the invention, the upper panel OP may further include a base substrate BL disposed on the color filter layer CFL. The base substrate BL may provide a base surface on which the color filter layer CFL, the light control layer CCL, and the like are disposed. The base substrate BL may be a glass substrate, a metal substrate, a plastic substrate, or the like. However, the embodiment of the invention is not limited thereto, and the base substrate BL may be an inorganic layer, an organic layer, or a composite material layer. In an alternative embodiment of the invention, the base substrate BL may be omitted.

The partition pattern BMP may include a material having a transmittance of less than or equal to a predetermined value. In an embodiment, for example, the partition pattern BMP may include a black coloring agent to block light. The partition pattern BMP may include a black dye or a black pigment, which is mixed with a base resin. In an embodiment of the invention, the black coloring agent may include carbon black, a metal such as chromium, or an oxide thereof.

In an embodiment of the invention, the first to third light control units CCP1, CCP2, and CCP3 may be formed through an inkjet process. A liquid ink composition may be provided between the partition patterns BMP, and the provided ink composition may be polymerized through a thermal curing process or a light curing process to form the first to third light control units CCP1, CCP2, and CCP3. For convenience of illustration, FIG. 3 illustrates one first light control unit CCP1, one second light control unit CCP2, and one third light control unit CCP3. However, the display device DD may include a plurality of first light control units CCP1, a plurality of second light control units CCP2, and a plurality of third light control units CCP3, which are arranged along the second direction DR2 (refer to FIG. 1A).

Figure 4:
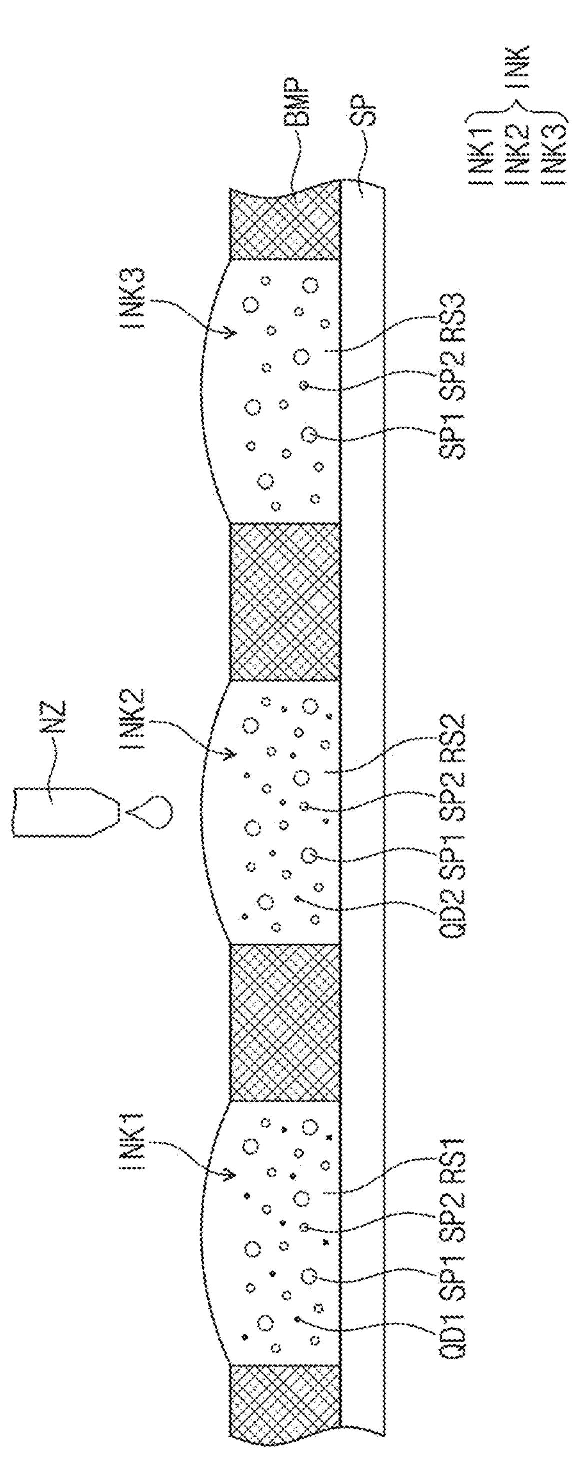
FIG. 4 illustrates a process of forming a light control unit by using an ink composition according to an embodiment of the invention.

FIG. 4 illustrates a process of forming a light control unit by using an ink composition according to an embodiment of the invention.

Referring to FIGS. 3 and 4 together, the light control units CCP1, CCP2, and CCP3 of FIG. 3 are formed using the ink composition INK. The ink composition INK may be sprayed onto a target substrate SP with a nozzle NZ or the like through an inkjet process. The target substrate SP may be the aforementioned color filter layer CFL or the lower panel DP.

The partition patterns BMP may be disposed to be spaced apart from each other on the target substrate SP, and the ink composition INK may be provided between the partition patterns BMP. The ink composition INK provided on the target substrate SP may be thermally cured or light-cured to form the light control units CCP1, CCP2, and CCP3.

The ink composition INK may include a first ink composition INK1 for forming the first light control unit CCP1 (refer to FIG. 3), a second ink composition INK2 for forming the second light control unit CCP2 (refer to FIG. 3), and a third ink composition INK3 for forming the third light control unit CCP3 (refer to FIG. 3).

The first ink composition INK1 may include a first quantum dot QD1, a first scatterer SP1, a second scatterer SP2, and a first resin composition RS1. A diameter of the first scatterer SP1 is in the range of about 150 nm to about 250 nm, and a diameter of the second scatterer SP2 is in the range of about 50 nm to about 100 nm. In such an embodiment, the first quantum dot QD1, the first scatterer SP1, and the second scatterer SP2 are substantially the same as those described above with reference to FIG. 3, and any repetitive detailed description thereof will be omitted or simplified.

The first resin composition RS1 is a medium in which the first quantum dot QD1 and the scatterers SP1 and SP2 are dispersed, and may include or be formed of various resin compositions that may be generally referred to as binders. In an embodiment, for example, the first resin composition RS1 may include an acrylic-based resin, a urethane-based resin, a silicone-based resin, an epoxy-based resin, or the like. The first resin composition RS1 may be a transparent resin.

The second ink composition INK2 may include a second quantum dot QD2, a first scatterer SP1, a second scatterer SP2, and a second resin composition RS2.

The second resin composition RS2 is a medium in which the second quantum dot QD2 and the scatterers SP1 and SP2 are dispersed, and may include or be formed of various resin compositions that may be generally referred to as binders. In an embodiment, for example, the second resin composition RS2 may include an acrylic-based resin, a urethane-based resin, a silicone-based resin, an epoxy-based resin, or the like. The second resin composition RS2 may be a transparent resin.

The third ink composition INKS may include a first scatterer SP1, a second scatterer SP2, and a third resin composition RS3.

The third resin composition RS3 is a medium in which the scatterers SP1 and SP2 are dispersed, and may include or be formed of various resin compositions that may be generally referred to as binders. In an embodiment, for example, the third resin composition RS3 may include an acrylic-based resin, a urethane-based resin, a silicone-based resin, an epoxy-based resin, or the like. The third resin composition RS3 may be a transparent resin. In an embodiment of the invention, the first to third resin compositions RS1, RS2, and RS3 may include or be composed of substantially a same material as each other. The first to third resin compositions RS1, RS2, and RS3 may be polymerized through a thermal curing process or a light curing process to form the first to third base resins BR1, BR2, and BR3.

In an embodiment, as shown in FIG. 3, each of the first to third light control units CCP1, CCP2, and CCP3 may include the first scatterer SP1 and the second scatterer SP2, but the embodiment of the invention is not limited thereto. In an embodiment, for example, only some of the first to third light control units CCP1, CCP2, and CCP3 may include a first scatterer SP1 and a second scatterer SP2.

In an embodiment, as shown in FIG. 4, each of the first to third ink compositions INK1, INK2, and INK3 includes the first scatterer SP1 and the second scatterer SP2, but the embodiment of the invention is not limited thereto. In an alternative embodiment, for example, only some of the first to third ink compositions INK1, INK2, and INK3 may include a first scatterer SP1 and a second scatterer SP2.

The first scatterer SP1 and the second scatterer SP2 serve as a scatterer to scatter light emitted from the lower panel DP. In an embodiment, for example, the first scatterer SP1 may be a main scatterer, and the second scatterer SP2 may be an auxiliary scatterer.

Figure 5:
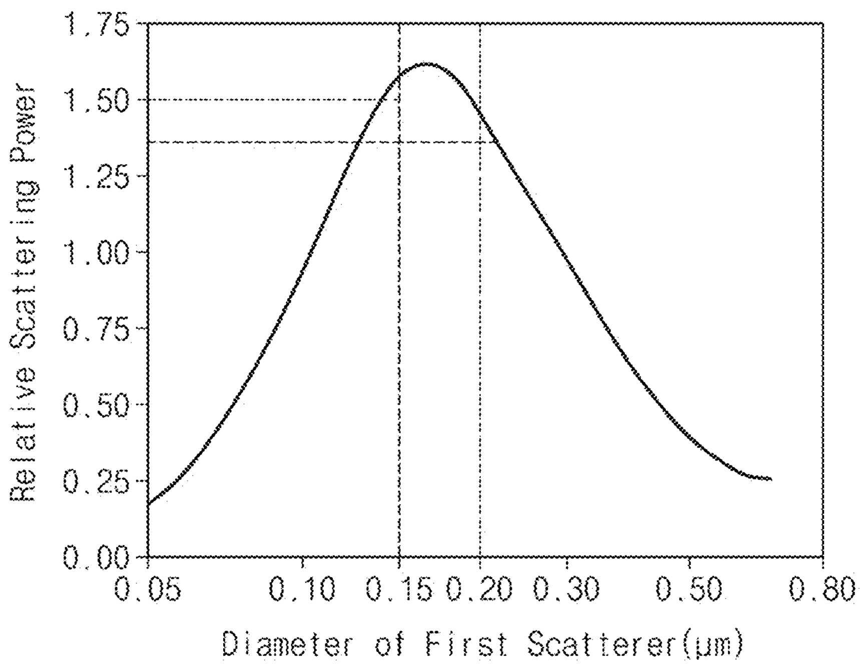
FIG. 5 is a graph showing a relative scattering power according to the diameter of a first scatterer.

FIG. 5 is a graph showing a relative scattering power according to the diameter of a first scatterer.

Specifically, FIG. 5 is a graph showing a relative scattering power according to the diameter of the first scatterer SP1 for blue light when the first scatterer SP1 is composed of rutile or $TiO_2$.

Referring to FIGS. 4 and 5 together, when the average diameter of the first scatterers SP1 is about 150 nm to about 250 nm, specifically, when the average diameter of the first scatterers SP1 is about 150 nm to about 180 nm, it can be seen that the first scatterer SP1 has a high scattering power for blue light.

In addition, when the average diameter of the second scatterers SP2 satisfies the range of about 50 nm to about 150 nm, the second scatterer SP2 may cause Rayleigh scattering for blue light.

Since the ink composition INK in an embodiment of the invention includes the first scatterer SP1 having an average diameter in a range of about 150 nm to about 250 nm and the second scatterer SP2 having an average diameter in a range of about 50 nm to about 150 nm, the ink composition INK may exhibit a high scattering power for blue light.

In embodiments of the invention, as described above, the light control layer CCL includes the first scatterer SP1 having an average diameter in a range of about 150 nm to about 250 nm and the second scatterer SP2 having an average diameter in a range of about 50 nm to about 150 nm in the first to third light control units CCP1, CCP2, and CCP3, such that the scattering power for blue light emitted from the lower panel DP may be improved. Accordingly, in the light control layer CCL, the transmittance of blue light or the rate of conversion, in which blue light is converted into red light or green light, may be improved, and the light control characteristics of the light control layer CCL may be improved.

In embodiments of the invention, the display device DD includes the light control layer CCL having high light control characteristics, such that the display device DD may exhibit high display quality.

In such embodiments, where the first and second scatterers SP1 and SP2 includes an inorganic material, the first and second scatterers SP1 and SP2 may be relatively heavy, compared to the quantum dots QD1 and QD2 and the first to third resin compositions RS1, RS2, and RS3.

In embodiments where the ink composition INK includes the second scatterer SP2, the settling rate of the first scatterer SP1 may be reduced, which will hereinafter be described in detail with reference to FIG. 6.

Figure 6:
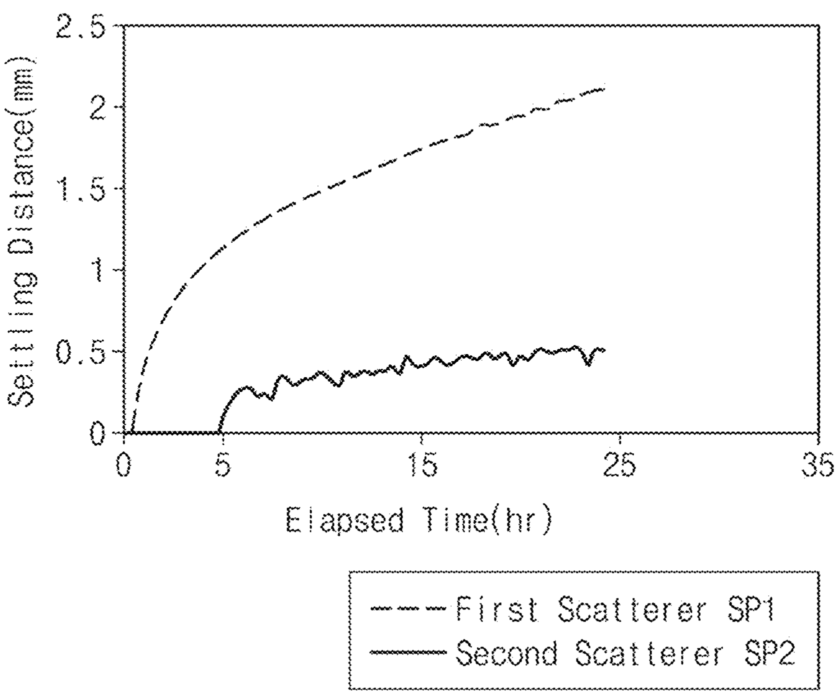
FIG. 6 is a graph showing a settling distance according to an elapsed time.

FIG. 6 is a graph showing a settling distance according to an elapsed time of each of the first scatterer SP1 and the second scatterer SP2 in the ink composition. In FIG. 6, each of the first scatterer SP1 and the second scatterer SP2 is a $TiO_2$ particle, and each of the first scatterer SP1 and the second scatterer SP2 is provided in plurality.

The first scatterer SP1 has a diameter of about 180 nm, and the second scatterer SP2 has a diameter of about 100 nm. The elapsed time (hr, hour) indicated on the x-axis of the graph means the time elapsed from when the first scatterer SP1 and the second scatterer SP2 are provided to the liquid composition. The settling distance (mm) indicated on the y-axis of the graph means the distance between the reference plane and the settled first scatterer SP1 or second scatterer SP2.

Referring to FIGS. 4 and 6, the first scatterer SP1 is settled before an elapsed time of 1 hour, and the second scatterer SP2 is settled after an elapsed time of 5 hours. As shown in FIG. 6, when the elapsed time approaches 25 hours, the settling distance of the first scatterer SP1 is about 2 mm or more, and the settling distance of the second scatterer SP2 is about 0.5 mm. That is, since the second scatterer SP2 has a diameter smaller than that of the first scatterer SP1, it can be seen that the settling rate of the second scatterer SP2 is slower than that of the first scatterer SP1.

In embodiments of the invention, as described above, the ink composition INK includes a plurality of first scatterers SP1 having a diameter of about 150 nm to about 250 nm and a plurality of second scatterers SP2 having a diameter of about 50 nm to about 100 nm, the first scatterers SP1 and the second scatterers SP2 may cause a hindered settling effect. In such embodiments, the settling rate of the plurality of first scatterers SP1 is reduced in the ink composition INK due to the influence of the hindrance caused by the plurality of second scatterers SP2. As the number of second scatterers SP2 increases, the hindered settling effect may be increased. In an embodiment of the invention, each of the first scatterer SP1 and the second scatterer SP2 may be provided in plurality, and the number of the second scatterers SP2 may be greater than the number of the first scatterers SP1.

In an embodiment, where the diameters of the second scatterers SP2 is in the range of about 50 nm to about 100 nm, the light transmittance of the ink composition INK may be effectively maintained even in a case where the number of second scatterers SP2 increases.

In embodiments of the invention, the plurality of first scatterers SP1 are settled before the ink composition INK is ejected out of the nozzle NZ, such that the first scatterers SP1 may be effectively prevented from being concentrated on a specific portion.

Accordingly, in such embodiments, a difference in the number of the first scatterers SP1 among the plurality of first ink compositions INK1 provided by the nozzle NZ, a difference in the number of the first scatterers SP1 among the plurality of second ink compositions INK2 provided by the nozzle NZ, and a difference in the number of the first scatterers SP1 among the plurality of third ink compositions INK3 provided by the nozzles NZ may all be substantially reduced.

In embodiments, the light control layer CCL includes the first to third light control units CCP1, CCP2, and CCP3 formed using the ink composition INK, such that a difference in light transmittance among the light control units of a same type may be minimized. In an embodiment, for example, the difference in light transmittance among the plurality of first light control units CCP1 may be minimized, the difference in light transmittance among the plurality of second light control units CCP2 may be minimized, and the difference in light transmittance among the plurality of third light control units CCP3 may be minimized. Accordingly, in such embodiments, the optical properties of the light control layer CCL may be improved.

In embodiment where the display device DD includes the light control layer CCL formed using the ink composition INK described herein, a difference in brightness between the same pixel regions PXA (refer to FIG. 1A) may be minimized. Therefore, the display quality of the display device DD may be improved.

Figures 7A, 7B:
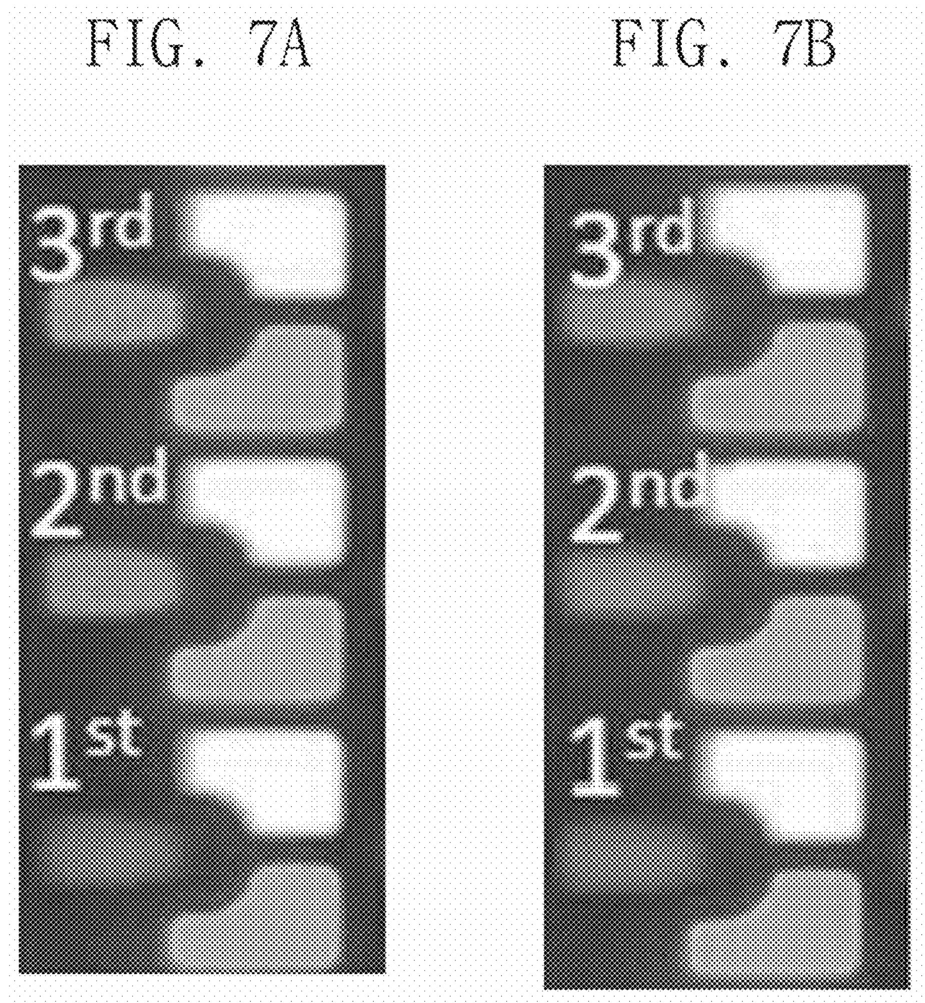
FIG. 7A is an image of a portion of the display device according to a comparative example.
FIG. 7B is an image of a portion of the display device according to an embodiment of the invention.

FIG. 7A is an image of a portion of the display device according to a comparative example. FIG. 7B is an image of a portion of the display device according to an embodiment of the invention.

FIG. 7A is an image of a display device including a light control layer formed using an ink composition according to the comparative example, which includes the first scatterer SP1 and does not include the second scatterer SP2. FIG. 7B is an image of a display device including a light control layer formed using an ink composition according to an embodiment of the invention, which includes the first scatterer SP1 and the second scatterer SP2, where the diameter and material of each of the first scatterer SP1 and the second scatterer SP2 are substantially the same as those described above.

Referring to FIG. 7A, in the display device according to the comparative example, it can be seen that a first ($1^{st}$) blue pixel region, a second ($2^{nd}$) blue pixel region, and a third ($3^{rd}$) blue pixel region are different in brightness from one another. Specifically, it can be seen that blue light is brightened in the order of the first ($1^{st}$) blue pixel region, the second ($2^{nd}$) blue pixel region, and the third ($3^{rd}$) blue pixel region.

Referring to FIG. 7B, it can be seen that there is little difference in brightness among the first (1st) blue pixel region, the second (2nd) blue pixel region, and the third (3rd) blue pixel region in the display device according an embodiment of the invention.

Figure 8:
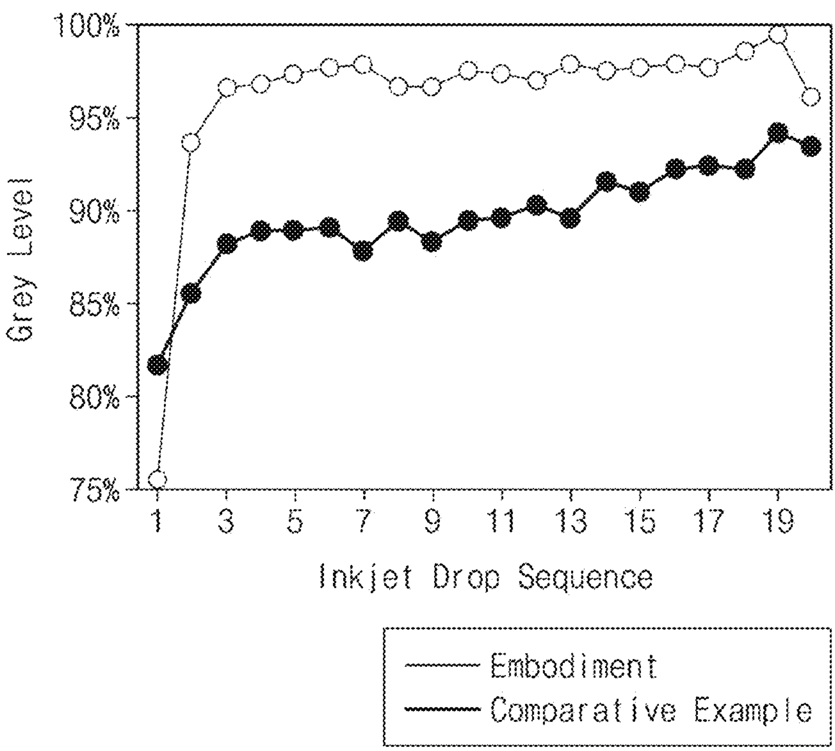
FIG. 8 is a graph showing a grey level according to an inkjet drop sequence.

In embodiments of the invention, as described above, since the display device DD includes the light control layer CCL formed using the ink composition INK in which the settling rate of the first scatterer SP1 is reduced, the difference in transmittance between the same pixel regions may be minimized. Accordingly, the difference in contrast between the same color lights in the display device DD may be minimized. FIG. 8 is a graph showing a grey level according to an inkjet drop sequence.

The comparative example of FIG. 8 is a third ink composition, which includes the first scatterer SP1 and does not include the second scatterer SP2. The embodiment of FIG. 8 is the third ink composition INK3 which includes the first scatterer SP1 and the second scatterer SP2. The third ink composition INK3 of the embodiment of FIG. 8 is substantially the same as those described above.

Referring to FIG. 8, in the case of the comparative example, the grey level of a first-inkjet-dropped third ink composition is about 85% or less, and the grey level of a nineteenth-inkjet-dropped third ink composition is close to about 95%. In the case of the embodiment, it can be seen that the grey level of a first-inkjet-dropped third ink composition is about 75%, and the grey level from a second-inkjet-dropped third ink composition to a nineteenth-inkjet-dropped third ink composition is stabilized to be close to about 95%.

That is, it is determined that the grey level of the third ink composition of the embodiment is stabilized in a shorter time than that of the third ink composition of the comparative example. In addition, in the third ink composition of the embodiment, since the grey levels of the second-to-nineteenth inkjet-dropped third ink compositions except for the first-inkjet-dropped third ink composition satisfy the range of about 93% to about 100%, it is determined that the difference between the grey levels of the third ink compositions according to the inkjet drop sequence is not great.

Figure 9:
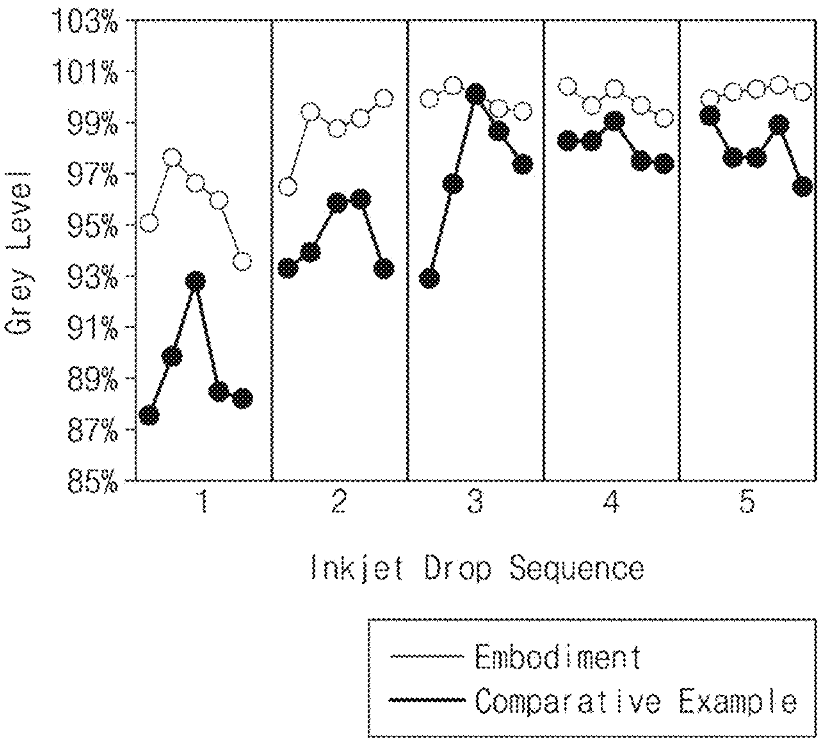
FIG. 9 is a graph showing a grey level according to an inkjet drop sequence.

FIG. 9 is a graph showing a grey level according to an inkjet drop sequence. In FIG. 9, unlike FIG. 8, the grey levels of the initial 5 ink compositions among the 11 inkjet-dropped ink compositions are illustrated as one group. Accordingly, the x-axis shows the grey levels of the ink compositions of each of the first to fifth groups.

Referring to FIG. 9, it can be seen that the grey level of the third ink composition of the embodiment is stabilized in a shorter time than that of the third ink composition of the comparative example. In addition, it is determined that the deviation of the grey levels of the third ink compositions of the embodiment from the first group to the fifth group is smaller than that of the grey levels of the third ink compositions of the comparative example.

Referring to FIGS. 8 and 9, in embodiments of the invention, the ink composition may include first scatterers and second scatterers of different sizes, where the diameters of the first scatterers is in the range of about 150 nm to about 250 nm, and the diameters of the second scatterers is in the range of about 50 nm to about 100 nm, the settling rate of the first scatterer, which is the main scatterer, may be reduced. Accordingly, the deviation of the grey levels among the ink compositions, which are dropped two or more times, may be minimized.

In embodiments of the invention, since the light control layer includes the light control units formed using the ink composition including first scatterers and second scatterers of different sizes, it is possible to minimize the difference in transmittance between the light control units configured to emit a same color. Accordingly, the light transmittance of the light control layer may be uniformly maintained, and the reliability of the light control layer may be improved.

In embodiments of the invention, since the display device includes a light control layer having a uniform light transmittance between the light control units, it is possible to prevent the occurrence of a difference in contrast for each pixel region. Accordingly, the display quality of the display device of the invention may be improved.

According to an embodiment of the invention, the ink composition may reduce the settling rate of a specific scatterer by including two types of scatterers.

According to an embodiment of the invention, the display device may exhibit improved reliability and high display quality by including scatterers of different sizes in the light control layer.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a lower panel comprising a base layer and a display element layer disposed on the base layer; and an upper panel comprising a light control layer, wherein the light control layer comprises a partition pattern and a light control unit, wherein the light control unit comprises a first scatterer and a second scatterer, and a diameter of the first scatterer is different from a diameter of the second scatterer; wherein the display element layer comprises a light-emitting element which emits blue light, the light control unit comprises:

a first light control unit comprising a first quantum dot which converts the blue light into red light;

a second light control unit comprising a second quantum dot which converts the blue light into green light; and a third light control unit which transmits the blue light, and each of the first to third light control units comprises the first scatterer and the second scatterer; wherein each of the first light control unit, the second light control unit and the third light control unit is provided as a single layer, and the first scatter and the second scatterer are co-located in each of the first light control unit, the second light control unit and the third light control unit.

2. The display device of claim 1, wherein the diameter of the first scatterer is in a range of about 150 nm to about 250 nm.

3. The display device of claim 1, wherein the diameter of the second scatterer is in a range of about 50 nm to about 150 nm.

4. The display device of claim 1, wherein each of the first scatterer and the second scatterer is provided in plurality, and a number of the plurality of first scatterers is less than a number of the plurality of second scatterers.

5. The display device of claim 1, wherein each of the first scatterer and the second scatterer independently comprises at least one selected from $TiO_2$, ZnO, $Al_2O_3$, $SiO_2$, and hollow silica.

6. The display device of claim 1, wherein the first scatterer and the second scatterer includes a same material as each other.

7. The display device of claim 1, wherein the upper panel further comprises a color filter layer disposed on the light control layer.

8. The display device of claim 7, wherein the color filter layer comprises:

a first filter which transmits the red light and is disposed on the first light control unit;

a second filter which transmits the green light and is disposed on the second light control unit; and a third filter which transmits the blue light.

9. The display device of claim 1, wherein the display element layer comprises a pixel defining film, wherein a light-emitting opening is defined in the pixel defining film, and a light-emitting element comprising a first electrode having a top surface exposed through the light-emitting opening, a second electrode facing the first electrode, and a light-emitting layer disposed between the first electrode and the second electrode, and the light-emitting opening overlaps the light control unit.

10. A display device comprising:

a lower panel comprising a display element layer which emits a first light; and an upper panel comprising a light control layer including a plurality of first scatterers and a plurality of second scatterers, wherein each of the plurality of first scatterers and the plurality of second scatterers scatters the first light, wherein an average diameter of the plurality of first scatterers is different from an average diameter of the plurality of second scatterers, the average diameter of the plurality of first scatterers is in a range of about 150 nm to about 250 nm, the average diameter of the plurality of second scatterers is in a range of about 50 nm to about 150 nm; wherein the display element layer comprises a light-emitting element which emits blue light, a light control unit comprises:

a first light control unit comprising a first quantum dot which converts the blue light into red light;

a second light control unit comprising a second quantum dot which converts the blue light into green light; and a third light control unit which transmits the blue light, and each of the first to third light control units comprises the first scatterer and the second scatterer, wherein each of the first light control unit, the second light control unit and the third light control unit is provided as a single layer, and the first scatter and the second scatterer are co-located in each of the first light control unit, the second light control unit and the third light control unit.

11. The display device of claim 10, wherein each of the plurality of first scatterers and the plurality of second scatterers comprises an inorganic material.

12. The display device of claim 11, wherein the inorganic material comprises at least one selected from $TiO_2$, ZnO, $Al_2O_3$, $SiO_2$, and hollow silica.

13. The display device of claim 10, wherein a wavelength of the first light is in a range of about 410 nm to about 480 nm.

* * * * *